United States Patent [19]

Nishimura

[11] Patent Number: 4,914,628
[45] Date of Patent: Apr. 3, 1990

[54] SEMICONDUCTOR MEMORY DEVICE HAVING SUBSTRATE ISOLATION OF A SWITCHING TRANSISTOR AND STORAGE CAPACITOR

[75] Inventor: Tadashi Nishimura, Hyogo, Japan

[73] Assignee: Mitsubishi Denki Kabushiki Kaisha, Tokyo, Japan

[21] Appl. No.: 124,429

[22] Filed: Nov. 18, 1987

[30] Foreign Application Priority Data

Nov. 19, 1986 [JP] Japan .................. 61-277032

[51] Int. Cl.[4] .................. G11C 11/34; G11C 11/24; H01L 29/78
[52] U.S. Cl. .................. 365/149; 365/182; 357/23.6
[58] Field of Search .............. 365/149, 182; 307/23.6, 307/41

[56] References Cited

U.S. PATENT DOCUMENTS

| | | | |
|---|---|---|---|
| 4,673,962 | 6/1987 | Chatterjee et al. | 365/149 |
| 4,717,942 | 1/1988 | Nakamura et al. | 357/23.6 X |
| 4,721,987 | 1/1988 | Baglee et al. | 357/23.6 X |
| 4,751,557 | 6/1988 | Sunami et al. | 365/149 |
| 4,752,819 | 6/1988 | Koyama | 365/149 |
| 4,761,385 | 8/1985 | Pfiester | 357/23.6 |
| 4,786,954 | 11/1988 | Morie et al. | 365/149 |
| 4,792,834 | 12/1988 | Uchida | 357/23.6 X |
| 4,794,563 | 12/1988 | Maeda | 365/149 |

OTHER PUBLICATIONS

ISSCC, Session XIX: Dynamic RAMs, "A 4Mb Dram with Cross Point Trench Transistor Cell", by A. H. Shah et al., Feb. 21, 1986, pp. 268–269.

Primary Examiner—Stuart N. Hecker
Assistant Examiner—Alfonso Garcia
Attorney, Agent, or Firm—Lowe, Price, LeBlanc, Becker & Shur

[57] ABSTRACT

A semiconductor memory has a first insulating layer formed on one major surface of a silicon single crystal substrate having a hole portion. The hole portion is filled with a material of a first conductivity type up to the depth of the first insulating layer. A first single crystal silicon layer is formed on the first insulating layer and a diffused region of the first single crystal silicon layer is formed on the first insulating layer and on the material of a first conductivity type. Source and drain regions are formed by doping the first single crystal silicon layer with a first impurity up to high degree of concentration. A second insulating layer is then formed on the first single crystal silicon layer with a low resistive portion formed on this second insulating layer to form source and drain regions. A second single crystal silicon layer is formed along the wall surfaces of the second insulating layer and the low resistive portion. A gate insulating film is formed along wall surfaces of the second single crystal silicon layer and the diffused region on the low resistive portion and having the hole portion on the material of a first conductivity type. Finally, a gate electrode is formed by filling the hole portion of the gate insulating film with the material of a first conductivity type.

7 Claims, 10 Drawing Sheets

SEMICONDUCTOR MEMORY DEVICE HAVING SUBSTRATE ISOLATION OF A SWITCHING TRANSISTOR AND STORAGE CAPACITOR

BACKGROUND OF THE INVENTION

1. Field of the Invention

The present invention relates generally to dynamic-type memory cells and more particularly to dynamic-type memory cells employing substrate isolation to increase cell density. The invention also relates to a method of making such cells.

2. Description of the Prior Art

Conventionally, a demand for a high degree of integration of semiconductor devices or VLSI has been met mainly with a technique of fine structure of semiconductor devices. Recently, however, a limit thereto is approaching and there is an active movement to realize a higher degree of densification by improving the structure of semiconductor devices as well as by expecting a breakthrough in lithography technique.

FIGS. 1 and 2 are schematic block diagrams of a conventional MOS dynamic RAM.

First, referring to FIGS. 1 and 2, the whole structure of the conventional MOS dynamic RAM is described. A row address signal is stored in a row address buffer 61. The row address signal stored in the row address buffer 61 is applied to a row decoder 62 and decoded so that the row direction of a memory cell array 63 is addressed. On the other hand, a column address signal is stored in a column address buffer 67 and the column address signal is decoded by a column decoder 66 and applied to the memory cell array 63 through a sense amplifier 65, with the result that the column address of the memory cell array 63 is specified.

An I/O circuit 68 is connected to the sense amplifier 65 and the input and output of the I/O circuit 68 is switched by an input and output control circuit 64. That is, when the I/O circuit 68 is switched on the input side, inputted data is stored in addressed and predetermined memory cells in the memory cell array 63 through the sense amplifier 65. When the I/O circuit 68 is switched on the output side, data is read from addressed and predetermined memory cells and outputted from the sense amplifier 65 through the I/O circuit 68. The memory cell array 63 comprises n×m memory cells and each memory cell is connected to a word line and bit line as shown in FIG. 2.

FIGS. 3 and 4 are a plan view and a sectional view, respectively, of a cross point cell proposed as a so-called ultimate feature of a fundamental cell of a dynamic RAM which is a leading example of such a high degree of integration, in which as a switching transistor a vertical transistor is employed using as a channel region the wall surface of a hole formed on a silicon substrate.

An example of the above mentioned cross point cell is disclosed in ISSCC 86 Lecture No. FAM 19.5. February, 1986, by A. H. Shah, et al.

Referring to FIGS. 3 and 4, numeral 1 denotes an n+ diffused layer serving as a drain and a bit line, numeral 2 denotes a polycrystal silicon serving as a word line, numeral 3 denotes a groove, numeral 4 denotes an isolating oxide film, numeral 5 denotes a channel portion of a switching transistor, numeral 6 denotes a gate oxide film, numeral 7 denotes a buried contact serving as a source, numeral 8 denotes a polycrystal silicon memory electrode, numeral 9 denotes a capacitor oxide film, numeral 10 denotes a gate electrode, and numeral 11 denotes a p+ substrate. The dimensions are W1=2.6 μm and W2=3.4 μm.

The manufacturing process thereof is now described to show problems of the thus structured semiconductor memory device as shown in FIGS. 5A to 5E. Referring to FIG. 5A, numeral 11 denotes a p-type substrate of high concentration, numeral 12 denotes a p-type (100) epitaxial growth layer of low concentration, numeral 13 denotes an n-type diffusion layer of high concentration formed by an ion implantation process, numeral 14 denotes a field isolating oxide film, numeral 15 denotes a groove formed by reactive ion etching, and numeral 16 denotes a thin gate oxide film ($SiO_2$) of 15 nm in thickness.

Referring to FIG. 5B, the groove 15 has been filled to the top with an n+ polycrystal silicon 171 and then partially removed by etching to the depth as shown, the oxide film 16 is thereafter etched from the top, so that a gap 18 which has been etched slightly deeper than the surface of the polycrystal silicon 171 is formed.

As shown in FIG. 5C, a polycrystal silicon layer 172 is then deposited on the polycrystal silicon 171 having the above-mentioned gap 18 and the gap 18 between the polycrystal silicon 171 and the wall is filled up.

In addition, as shown in FIG. 5D, the polycrystal silicon layer 172 on the polycrystal silicon 171, a wall of the groove 15, the n-type diffused layer 13 of a high concentration and the field isolating oxide film is removed by an anisotropic etching process. As a result, the polycrystal silicon film 172 is filled in the gap 18 between the above-mentioned polycrystal silicon 171 and the wall.

Finally, as shown in FIG. 5E, a semiconductor memory device including a vertical MOS transistor and a vertical capacitor is formed by forming a gate oxide film 19 and a gate electrode 20.

Now problems involved in the structure and the manufacturing process of the above-mentioned semiconductor memory device will be described. In the above-mentioned semiconductor memory device, the step between the surface of the buried polycrystal silicon 171 and the major surface becomes a channel length 36 of a vertical MOS transistor as shown in FIG. 5E, and the etching of the polycrystal silicon 171 must be controlled very precisely.

In addition, the doping of the channel region is affected substantially by autodoping as a result of a tendency of ions to migrate from the more heavily doped layer 11 to layer 12.

In addition, since wall surfaces tend to have different crystal orientations forming the channel regions, non-uniformity of the threshold voltage is caused. Furthermore, a thin polycrystal silicon is deposited and, after the n+ polycrystal silicon 171 and wall surfaces are buried, plasma etching is performed with $CF_4$. This plasma etching induces crystal defects in the semiconductor surface which forms a channel, tending to degrade all transistor characteristics.

In addition, if an interval of each memory cell is shortened in the above-mentioned MOS dynamic RAM, an electric charge leaks from transistor of one memory cell to a capacitor for storage of the other memory cell and, as a result, malfunction is caused.

SUMMARY OF THE INVENTION

The present invention was made in view of these points, and an object of the present invention is to provide a semiconductor memory device which solves all the problems of the above mentioned structure and manufacturing process.

In order to achieve these aims, the present invention comprises a first insulating layer formed on one major surface of a silicon single crystal substrate, a hole portion filled with a material of a first conductivity type in the inside thereof up to the depth of the first insulating layer, a first single crystal silicon layer formed on the first insulating layer, a diffused region of the first single crystal silicon layer formed on the first insulating layer and on the material of a first conductivity type to be a source and drain regions by doping this first single crystal silicon layer with a first impurity up to high degree of concentration, a second insulating layer formed on the first single crystal silicon layer, a low resistive portion formed on this second insulating layer to be a source and drain regions, a second single crystal silicon layer formed along wall surfaces of the second insulating layer and the low resistive portion, a gate insulating film formed along wall surfaces of the second single crystal silicon layer and the diffused region on the low resistive portion and having the hole portion on the material of a first conductivity type, and a gate electrode formed by filling the hole portion of this gate insulating film with the material of a first conductivity type.

According to the present invention, even if a spacing between devices is reduced, no charging occurs from one transistor to the other capacitor for a memory adjacent to this transistor.

The provision of substrate isolation in accordance with the principles of the present invention provides improved memory cell density without degrading memory cell performance, including cross coupling of charge, soft error as a result of alpha particle impact and non-uniformity as well as crystal defects that tend to occur in the prior art.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
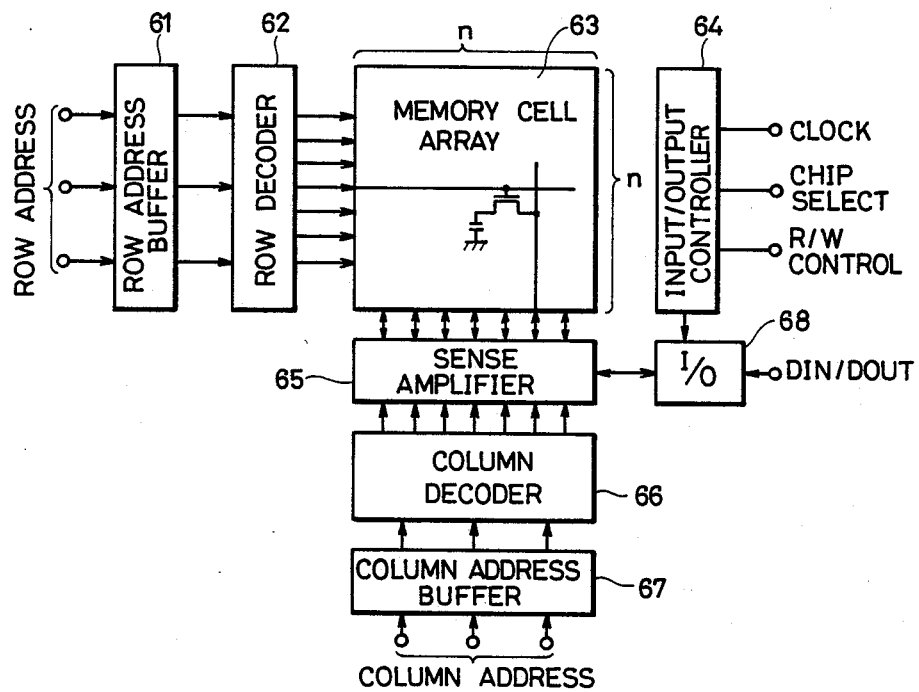
FIGS. 1 and 2 are block diagrams showing a structure of a conventional MOS dynamic RAM.
Figure 2:
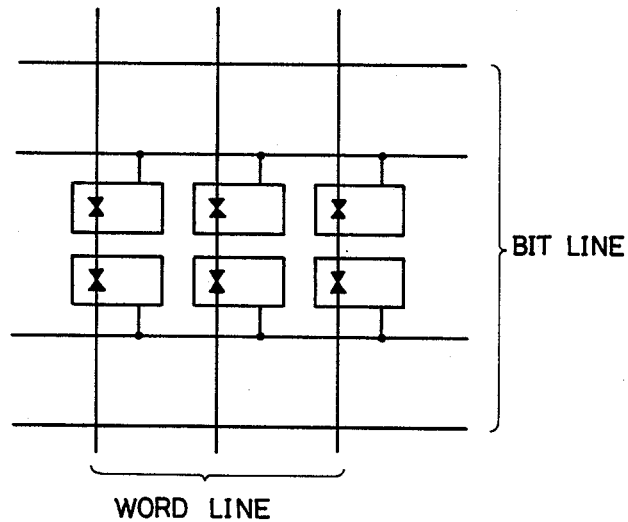
Figure 3:
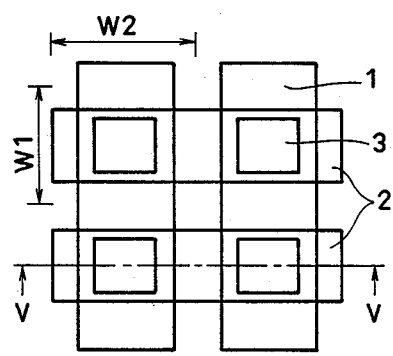
FIGS. 3 and 4 are a plan view and a cross view showing a conventional semiconductor memory device.
Figure 4:
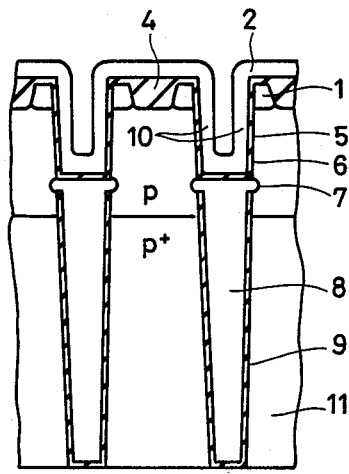
Figure 5A:
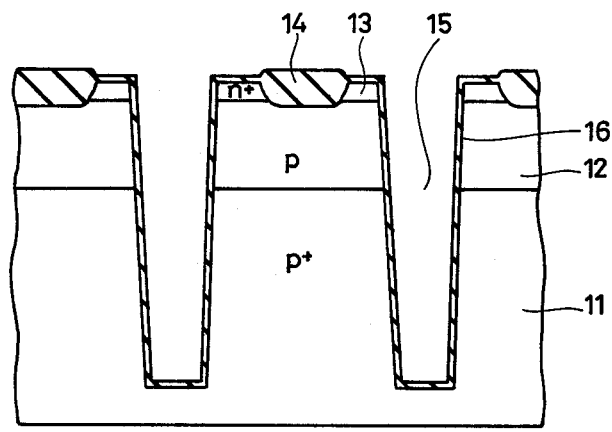
FIGS. 5A to 5E are sectional views showing a manufacturing process of the conventional semiconductor memory device.
Figure 5B:
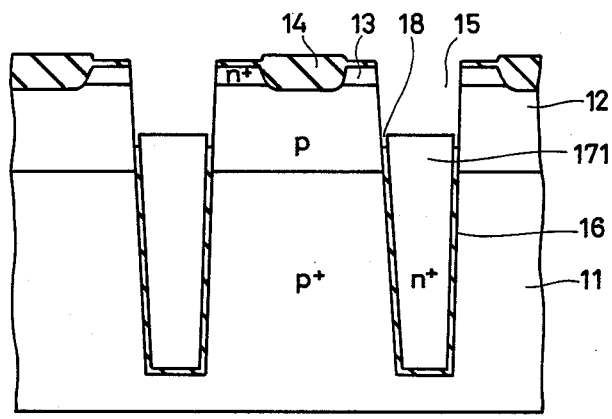
Figure 5C:
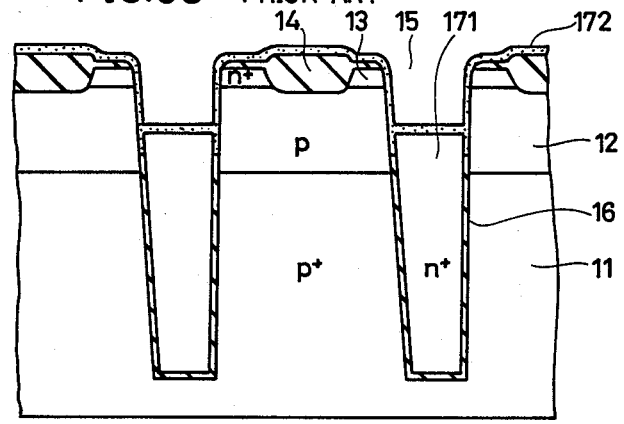
Figure 5D:
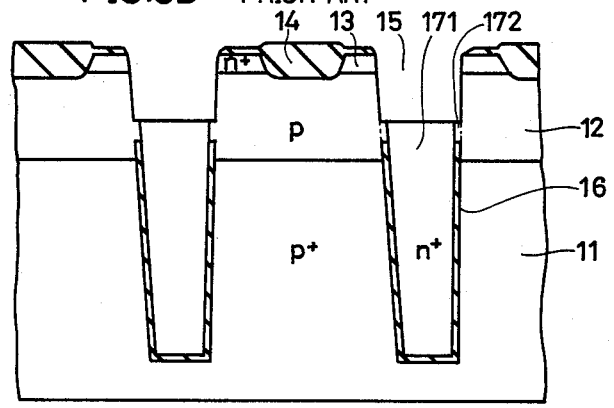
Figure 5E:
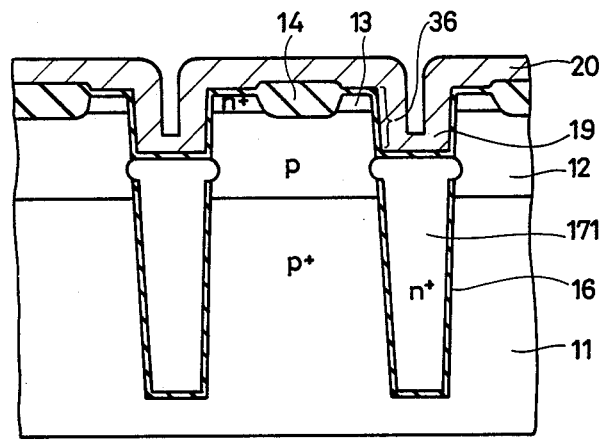
Figure 6:
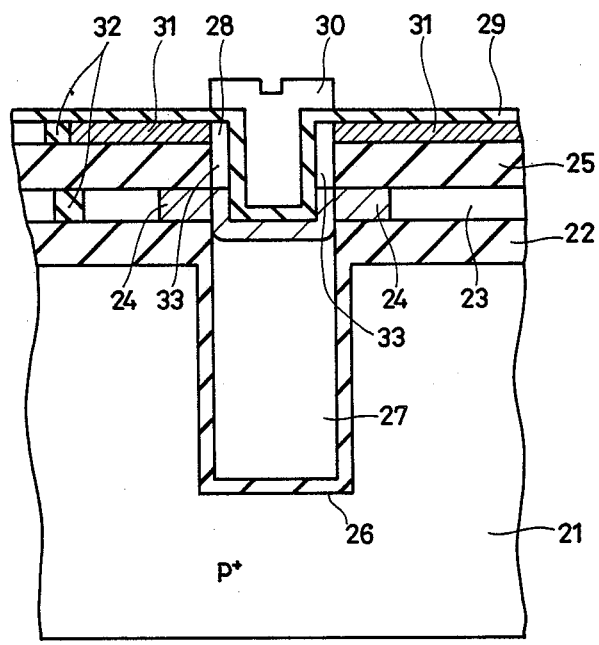
FIG. 6 is a sectional view showing an embodiment of a semiconductor memory device in accordance with the present invention.

An embodiment of a semiconductor memory device in accordance with the present invention is shown in FIG. 6, showing a vertical integrated transistor structure constructed in accordance with the present invention.

Referring to FIG. 6, a $SiO_2$ layer 22 serving as a first insulating layer of about 3000 Å in thickness is formed on a p+ silicon (100) substrate 21 serving as a silicon single crystal substrate doped with boron with a relatively high degree of concentration, and a first single crystal silicon layer (SOI layer) 23 of about 5000 Å in thickness is formed thereon. A diffused layer 24 is a diffused region of the single crystal silicon layer 23 which became an n-type by doping arsenic to a high degree of concentration, and becomes a source or drain. A $SiO_2$ layer 25 has an almost vertical wall surface and becomes a second insulating layer of 1 $\mu$m in thickness, and an insulating film 26 for a capacitor is a $SiO_2$ film of 100 Å in thickness formed on a wall surface of a hole of approximately 2 $\mu$m in diameter formed deeply in the silicon substrate 21.

A first conductivity type (n) polycrystal silicon 27 is formed by being doped with phosphorus to a high degree of concentration, and a single crystal silicon layer 28 is caused to be amorphous by ion implantation of Si to a polysilicon layer deposited by a chemical vapor deposition (CVD) method and then it is caused to be a single crystal along the $SiO_2$ layer 25 on the basis of the crystal of the diffused region 24 by a low temperature anneal of approximately 600° C., which portion becomes a channel region 33.

In addition, a gate oxide film 29 is formed to be 150 Å in thickness on the single crystal silicon layer 28. An n-type single crystal silicon gate electrode 30 is formed by being doped with phosphorus, and an n-type low resistive region 31 formed by ion implantation of arsenic using the gate electrode 30 as a mask serves as a low resistive portion and then becomes a source or a drain. A $SiO_2$ isolating oxide film 32 is provided to isolate the single crystal silicon layer 23 and the low resistive region 30 on the insulating layers 22 and 25 from respective adjacent devices.

As thus structured, the semiconductor memory device has the following characteristics.

More specifically, both a switching transistor and a capacitor for memory are isolated from the silicon substrate 21 completely, thereby preventing virtually a soft error by a radioactive ray from occurring. In addition, a single memory cell can be disposed over all the area allotted and the isolating oxide film 32 need be only provided at the limit value of fine working.

Figure 7A:
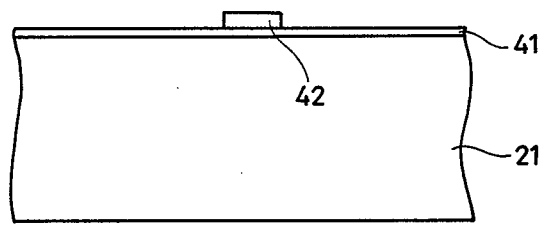
FIGS. 7A to 7L are sectional views showing a manufacturing process of the device in FIG. 6.
Figure 7B:
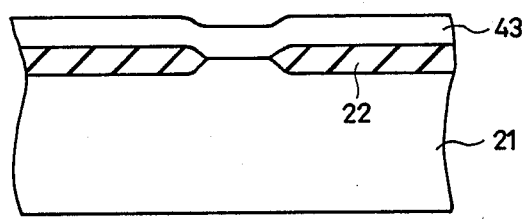
Figure 7C:
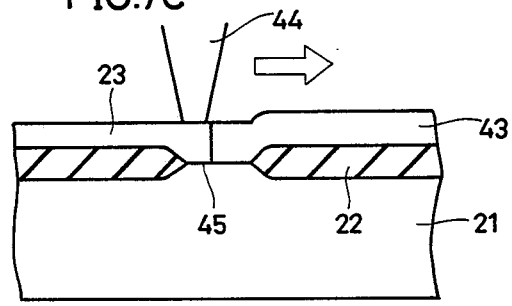

In addition, this structure has an advantage that much greater reproductivity and uniformity than those of the conventional one can be provided during the manufacturing process. This will be described with reference to the manufacturing flow of FIGS. 7A to 7L. First the silicon substrate 21 shown in FIG. 7A is prepared which has the orientation of (100) at the major surface and is of the p-type doped with boron by approximately $10^{19}/cm^3$. Next, a silicon nitride film is formed on a thin underlying oxide film 41 to leave a pattern 42 of approximately 0.8 $\mu m\square$.

This is exposed to an oxidizing atmosphere to form the $SiO_2$ layer 22 of approximately 4000 Å in thickness. This $SiO_2$ layer 22 is etched during a process of removal of a silicon nitride film and the like, so that the thickness thereof is reduced to approximately 3000 Å, and then a polycrystal silicon layer 43 is deposited by a CVD method (in FIG. 7B).

As an argon laser beam 44 of continuous oscillation of approximately 100 μm is radiated while scanning with a power of 10-16 W, by keeping the temperature of the wafer of the above mentioned structure at 450° C., whereby the polycrystal silicon layer 43 is molten and recrystallized and particularly a heat around an opening 45 escapes to the substrate side, so that crystal growth occurs from the opening 45 to outside on the basis of the crystal of this substrate. At this time, as approximately 100 μm around the opening 45 is single crystallized, if the opening 45 is disposed closer than this distance, all the silicon layer 43 on the SiO$_2$ layer 22 will be single crystallized to become the single crystal silicon layer 23 (in FIG. 7C).

Figure 7D:
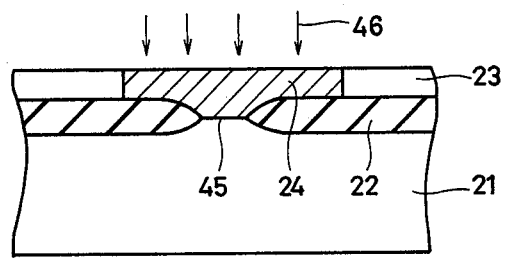

Then a photolithographic process is performed and ion implantation is selectively performed with arsenic around the opening 45 as shown by an arrow 46 (in FIG. 7D).

Figure 7E:
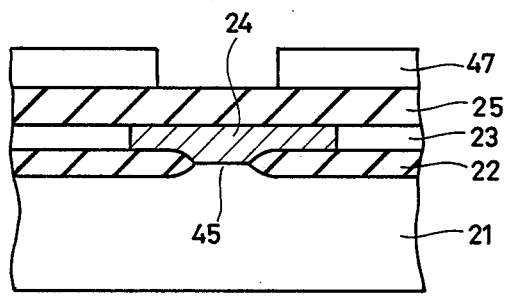
Figure 7F:
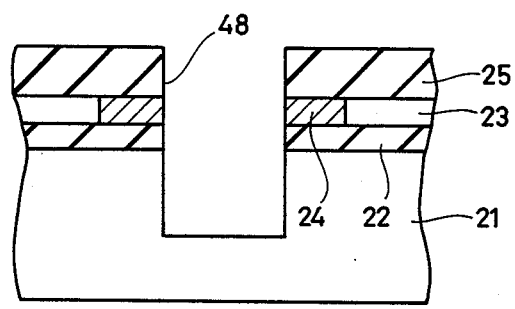
Figure 7G:
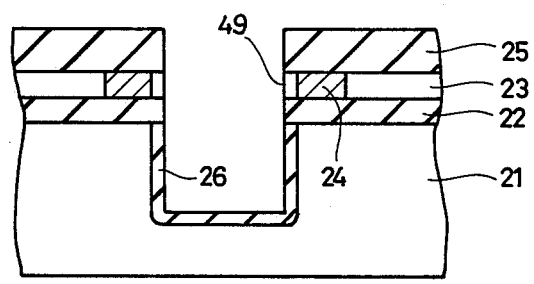

Then, the SiO$_2$ layer 25 of 0.8 μm is deposited on the above mentioned structure by CVD and a patterned mask 47 which is resistant to a deep trench etching following this process is formed on the top (in FIG. 7E).

Thereafter, a hole portion of approximately 8 μm in depth reaching the silicon substrate 21 is made in this structure in which SiO$_2$ and Si appear alternately. At that time, a wall surface 48 is kept almost flat by appropriate gas exchange (in FIG. 7F).

After that, the device of the above mentioned structure is exposed to an oxidizing atmosphere to be oxidized at 1000° C. At that time, a SiO$_2$ layer 49 of 100 Å is formed on the side wall 26 of the hole portion of the silicon substrate 21 and the wall surface of the single crystal silicon layer 23 (in FIG. 7G).

Following the above, an n-type of polycrystal silicon doped with phosphorus is thickly deposited and etching back is performed from the surface thereof, so that a structure having the polycrystal silicon 27 filled only in the hole portion is made. At that time, it is not necessary to control strictly the condition of the deposition film thickness and the etching back, but it is only necessary that the wall surface of the single crystal silicon layer 23 is exposed. When SiO$_2$ etching is performed in HF, then the SiO$_2$ 49 of wall surface is removed and the diffused layer 24 of a single crystal silicon is exposed (in FIG. 7H).

Next, a polycrystal silicon layer of 2000 Å in thickness is formed by CVD method. The Si is subjected to ion implantation of approximately $5 \times 10^{15}/\text{cm}^2$ at 40 keV to form an amorphous silicon layer 50 (in FIG. 7I). In making ion implantation, however, it is necessary to make the wafer angle inclined such that ion implantation may be performed at the side wall.

Then, after the heat treatment is performed on the wafer for ten hours at 600° C., the amorphous silicon layer 50 causes epitaxial single crystal growth adjusted to the crystal axis of the diffused layer 24 of the adjacent single crystal layer 23 to form the single crystal 28 from the wall surface of the SiO$_2$ layer 25 to the surface thereof. Then, a region 51 which is far from the diffused layer 24 serving as a seed portion causes nucleus growth independently to become polycrystal. At that time, the impurity of the diffused layer 24 moves little because of a low temperature, so that it does not enter the single crystal region 28 (in FIG. 7J).

Then, gate oxidation is performed in an oxidation atmosphere at 950° C. again to form the gate oxide film 29 of 100 Å in thickness on the single crystal silicon layer 28. Then the polycrystal silicon 30 doped with phosphorus is deposited by CVD method (in FIG. 7K).

Figure 7H:
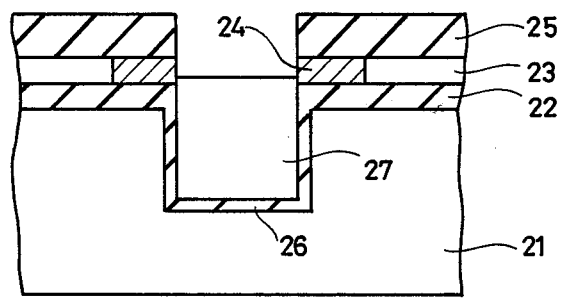
Figure 7I:
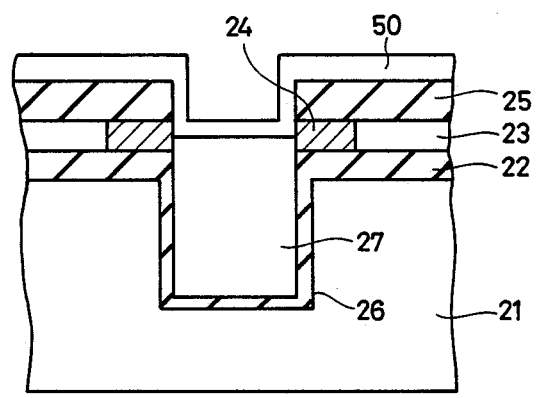
Figure 7J:
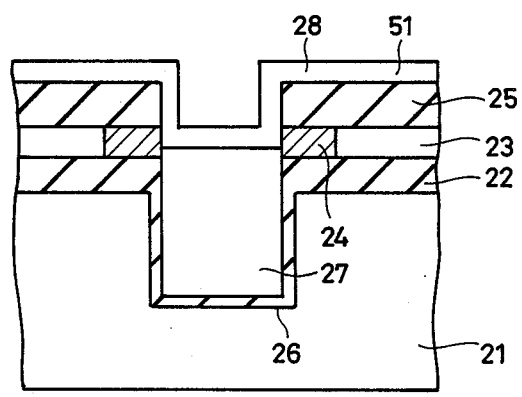
Figure 7K:
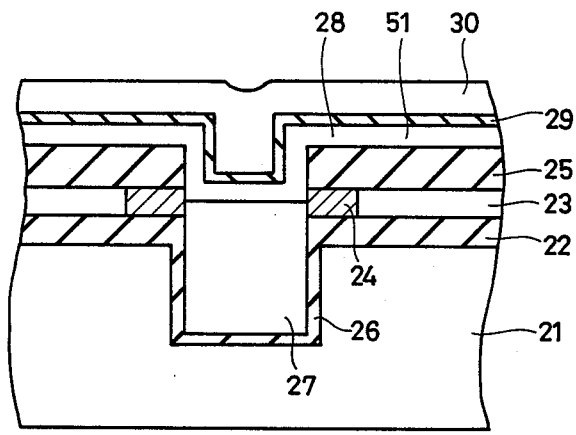
Figure 7L:
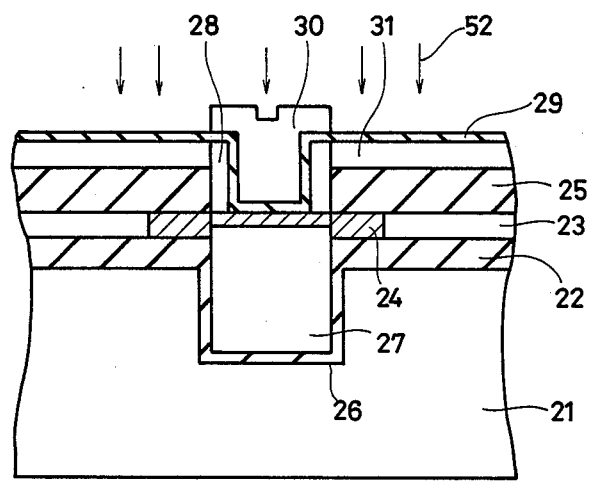

Then, the polycrystal silicon 30 is subjected to patterning to be a gate electrode and ion implantation is further made of arsenic using the polycrystal silicon 30 as a mask as shown by an arrow 52, whereupon a heat treatment for activation is performed, whereby the low resistive region 31 to become a source and drain regions is formed (in FIG. 7L). The region of the single crystal silicon layer 28 in contact with the underside or diffused layer 24 is made low resistive due to diffusion of an impurity during this heat treatment.

As above mentioned, the memory cell of FIG. 6 is formed. As it is apparent in the manufacturing process, according to the conventional method, the etching condition of the deposited film thickness of the polycrystal silicon 27 filling a deep hole portion had to be controlled in an extremely precise manner; however, according to the present invention it follows that it is enough to form the same to the width of about 3000 Å.

In addition, a direct contact connecting a MOS transistor and a capacitor for memory, that is, in this case a position setting of the region in which the diffused region 24 is in contact with the single crystal silicon layer 28 can be performed very accurately and positively and also with a big margin. Conventionally, this position setting required as a very fine control as deciding the fate of semiconductor memory devices.

In addition, it should be easily understood that patterning isolation is made at the stage of forming the first single crystal silicon layer 23, and by isolating the second single crystal silicon layers 28 and 51 (see FIG. 7K), isolation from an adjacent memory cell can be performed completely with ease, while reserving a sufficient area of active region.

Figure 8:
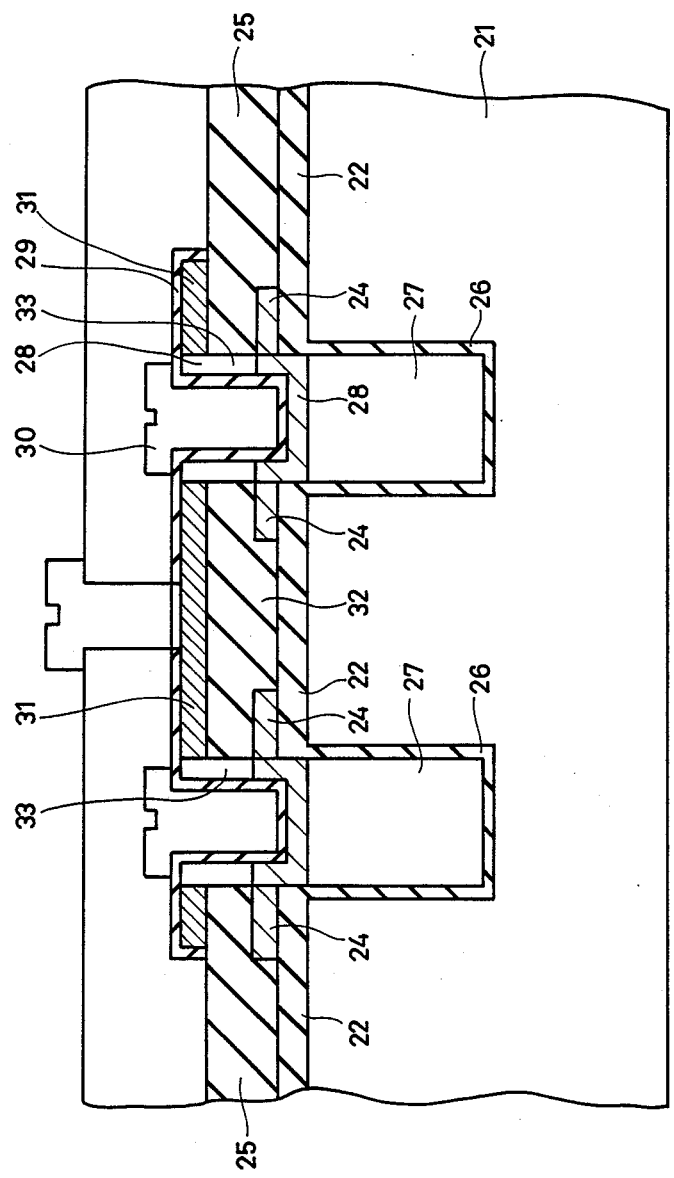
FIG. 8 is a view showing an example in which two memory cells, one of which is shown in FIG. 6, are arranged adjacently.

FIG. 8 is a view showing an example including two semiconductor memory cells disposed adjacent to each other, one of them being shown in FIG. 6. As apparent from FIG. 8, even if two semiconductor memory cells in accordance with the present invention are disposed adjacent to each other, malfunction can be prevented without any leakage of the electric charge from the transistor of one memory cell to the capacitor for storage of the other memory cell because the SiO$_2$ isolating oxide film 32 is provided between the diffused layer 24 of one memory cell and the diffused layer 24 of the other memory cell, and the channel region 33 of one memory cell and the channel region 33 of the other memory cell.

Figure 9:
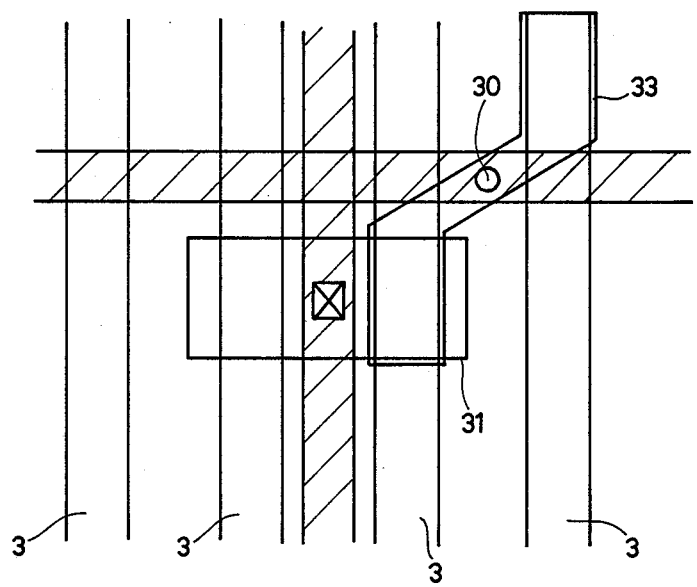
FIGS. 9 and 10 are sectional views of another embodiment of the present invention showing a structure of a semiconductor memory cell in which a wall surface of a groove serves as the channel region.
Figure 10:
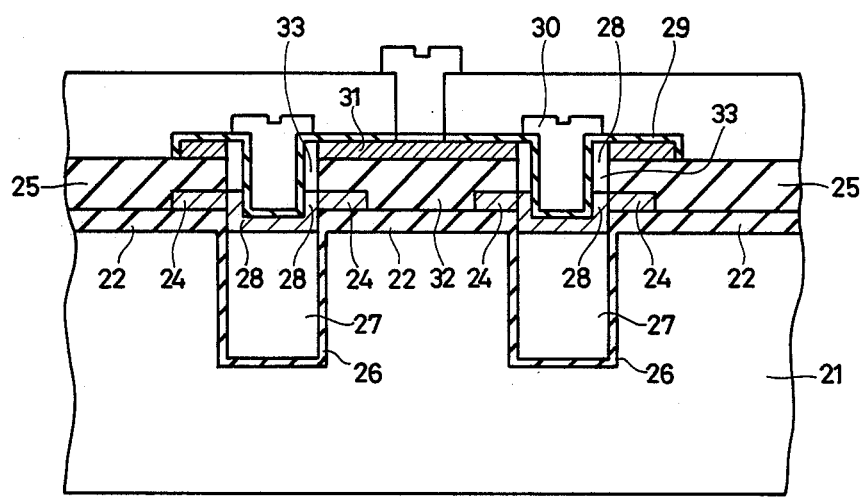

FIG. 9 is a plan view of another embodiment of the present invention and FIG. 10 is an sectional view showing a structure of a semiconductor memory cell in which a wall surface of respective grooves serves as a channel region. In the embodiment shown in FIGS. 9 and 10, a groove 3 is formed in parallel with a bit line in place of the above-mentioned hole shown in FIGS. 6 and 8. A wall surface of the groove 3 is formed as the channel region 33 and the sectional structure shown in FIG. 10 is shown like an example shown in FIG. 7.

Although a memory cell of a hole configuration is shown in the above embodiment, it is also apparent that the same effect can be obtained using a groove configuration as shown in the sectional view of FIG. 6. Also in forming the first single crystal silicon layer 23, a laser recrystallization method was employed; however, since the role of this single crystal silicon layer 23 is to serve as a seed crystal during solid phase epitaxial growth of the single crystal silicon layer 28 and also to make direct contact with a capacitor electrode as a source and drain of a MOS transistor upon doping of impurity, it is possible to apply other formation methods such as a molten and recrystallization method by an electronic beam and a lamp, a method of performing solid phase epitaxial growth by providing an amorphous silicon layer as well as the low resistive region 31, or a lateral epitaxial overgrowth method providing single crystal region on $SiO_2$. In addition, it is needless to say that a method of forming of a buried oxide film by oxygen ion implantation is also effective as a typical method of formation method of a single crystal silicon which does not need the opening 45 (in FIG. 7C).

As mentioned above, according to the embodiment of the present invention, an occurrence of a soft error by radioactive rays can be prevented since both the switching transistor and the capacitor for storage are insulated completely from the silicon substrate 21 by forming the $SiO_2$ layer 22 as a first insulating layer on a major surface of the silicon substrate 21.

In addition, since positioning of a contact region of the diffused layer 24 and the polycrystal silicon layer 28 can be performed with precision and large margin, a semiconductor memory cell with a good reproducibility can be manufactured. In addition, when etching back is performed from the surface, as shown in FIG. 7H, after the deposition of the polycrystal silicon in a hole, it is enough to make an etching process such that a wall surface of the $SiO_2$ layer 22 may appear within the range of 3000 Å and, as a result, a manufacturing method becomes simple and a semiconductor memory cell with a considerable reproducibility can be manufactured without very precise control.

In addition, as shown in FIG. 8, even if two semiconductor memory cells are disposed adjacent to each other, an electric charge does not leak from the transistor of one memory cell to the capacitor for storage of the other memory cell and malfunction can be prevented since the $SiO_2$ insulating oxide film 32 is formed between the diffused layer 24 of one memory cell and the diffused layer 24 of the other memory cell and also the $SiO_2$ isolating oxide film 32 is formed between the channel region 33 of one memory cell and the channel region 33 of the other memory cell.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. In a dynamic semiconductor memory of a type forming an array of vertical integrated transistors within a common substrate having a major surface, wherein each of said vertical integrated transistors comprises vertically orientated semiconductor layers defining source and drain regions, and a trench extending into said substrate at said source and drain regions to define a channel region, a lowermost one of said layers of said vertical integrated transistor in said substrate formed of a polycrystal semiconductor layer and defining one of the source region and drain region:

the improvement comprising a first insulating layer underlying said polycrystal semiconductor layer and a second insulating layer formed on said polycrystal semiconductor layer above a portion of the substrate surrounding said trench surrounding said trench, and extending outside said trench on the major surface of said substrate to isolate said vertical integrated transistor from said substrate and to reduce soft errors of said transistor by electron-hole pairs produced in said substrate as a result of ambient alpha particles penetrating said substrate.

2. A dynamic semiconductor memory having substrate isolation in accordance with claim 1, comprising:
an isolation insulating film formed on said first insulating layer and isolating said polycrystal semiconductor layer from a polycrystal semiconductor layer of adjacent cells.

3. A dynamic semiconductor memory having substrate isolation in accordance with claim 1, comprising:
an electrode provided so as to electrically couple said channel region to a word line.

4. A dynamic semiconductor memory having substrate isolation in accordance with claim 1, wherein said polycrystal semiconductor layer comprises a diffused layer.

5. A dynamic semiconductor memory having substrate isolation in accordance with claim 1, comprising:
a low resistive portion formed on said second insulating film and electrically coupled to said channel region, said low resistive portion comprising a bit line.

6. The semiconductor memory device in accordance with claim 1, wherein the material of said first and second insulating layers is $SiO_2$.

7. A semiconductor memory device, comprising:
a silicon single crystal substrate having a major surface and a trench portion formed therein, the trench portion defined by a wall and bottom surface;
a first insulating layer on the wall and bottom surface of said trench portion and extending outside the trench portion on the major surface of said substrate;
said trench portion being filled in the inside thereof with a material of a first conductivity type up to the depth of said first insulating layer;
a first single crystal silicon layer formed on said first insulating layer;
diffusion regions in said first single crystal silicon layer serving as source and drain regions formed on said first insulating layer and said material of the first conductivity type by doping said first single crystal silicon layer with a first impurity to a high degree of concentration;
a second insulating layer formed on said first single crystal silicon layer;
a low resistive portion serving as a source or drain region formed on said second insulating layer;
a second single crystal silicon layer formed along inner surfaces of said second insulating layer and said low resistive portion;
a gate insulating layer formed on said low resistive portion and along said surface of said second single crystal silicon layer and said diffused region and having a trench portion on said material of a first conductivity type; and
a gate electrode formed by filling a material of a first conductivity type in the trench portion of said gate insulating layer above the trench portion of said substrate;
said low resistive portion being electrically coupled to a bit line and said gate electrode being connected to a word line.

* * * * *